United States Patent
Simburger et al.

(10) Patent No.: US 7,045,246 B2
(45) Date of Patent: May 16, 2006

(54) INTEGRATED THIN FILM BATTERY AND CIRCUIT MODULE

(75) Inventors: Edward J. Simburger, Agoura, CA (US); James H. Matsumoto, Los Angeles, CA (US); Paul A. Gierow, Madison, AL (US); Aloysius F. Hepp, Bay Village, OH (US)

(73) Assignees: The Aerospace Corporation, El Segundo, CA (US); SRS Technologies, Inc., Huntsville, AL (US)

( * ) Notice: Subject to any disclaimer, the term of this patent is extended or adjusted under 35 U.S.C. 154(b) by 561 days.

(21) Appl. No.: 10/420,463

(22) Filed: Apr. 22, 2003

(65) Prior Publication Data

US 2004/0214079 A1    Oct. 28, 2004

(51) Int. Cl.
*H01M 2/22* (2006.01)
(52) U.S. Cl. .................. 429/124; 429/96; 429/122
(58) Field of Classification Search ............... 429/122, 429/124
See application file for complete search history.

(56) References Cited

U.S. PATENT DOCUMENTS

| | | | | |
|---|---|---|---|---|
| 5,954,751 A | * | 9/1999 | Chen et al. | 607/5 |
| 6,152,597 A | * | 11/2000 | Potega | 374/185 |
| 6,697,694 B1 | * | 2/2004 | Mogensen | 700/119 |
| 6,916,679 B1 | * | 7/2005 | Snyder et al. | 438/64 |
| 6,967,362 B1 | * | 11/2005 | Nam et al. | 257/254 |

* cited by examiner

*Primary Examiner*—Mark Ruthkosky
(74) *Attorney, Agent, or Firm*—Derrick Michael Reid

(57) ABSTRACT

One or more thin film battery cells are embedded in a multilayer thin film flexible circuit board supporting electronic devices, such as power regulators, for forming an integrated battery and circuit module. The module can be made using conventional thin film processes. The module is well suited for applications where size and space limitations, such as on spacecraft or credit cards, require the use of ultra thin power sources integrated with respective electronic devices and printed circuits.

14 Claims, 2 Drawing Sheets

INTEGRATED THIN FILM BATTERY AND CIRCUIT MODULE

INTEGRATED THIN FILM BATTERY AND
CIRCUIT MODULE

INTEGRATED THIN FILM BATTERY AND CIRCUIT MODULE MANUFACTURING PROCESS

INTEGRATED THIN FILM BATTERY AND CIRCUIT MODULE

FIELD OF THE INVENTION

The invention relates to the field of batteries and printed circuit boards. More particularly, the present invention relates to thin film batteries disposed within thin film printed circuits for localized powering of electronic devices.

BACKGROUND OF THE INVENTION

Microsatellites and nanosatellites have been developed for use in space. The development and use of small space systems is likely to increase with new technologies. In U.S. Pat. No. 6,300,158 titled Integrated Solar Power Module, a method is described for producing thin film solar cells that are integrated with a multilayer printed wiring board and power processing electronics. In U.S. Pat. No. 6,127,621 a novel architecture for a satellite power system is described using various electronic devices such as power regulators. This architecture decentralizes the generation, distribution, and storage of electrical energy on the spacecraft using many individual electronic chargers and regulators. Traditionally, the battery is a separate component on the spacecraft. The battery is typically composed of a number of individual battery cells connected in a series to provide the necessary voltage to the bus. The batteries and individual battery cells may also be connected in parallel to provide the necessary curt to the bus. In the power system, each individual battery cell is connected to a main power distribution bus with a respective individual DC-DC converter that performs the function of providing current to the battery from the bus when sufficient energy is available from attached power sources, and, to supply power from the battery to the bus when the power from the power sources is insufficient to supply power to a load connected to the bus.

Typically, power distribution, power processing, and load electronics are mounted on rigid or flexible printed wiring boards with the battery located in a remote and completely separate battery housing structure. The separation of the battery from the powered electronics disadvantageously requires the use of macroscale power bus systems.

The battery cells of a battery are usually contained in a metal or plastic container with two terminals. The power electronics are usually remotely mounted on rigid or flexible printed wiring boards. In some cases, the battery cells have been mounted on printed wiring boards to provide some capability to store electrical energy locally to the power electronics. However, the battery cells only supplies power, and needs charging and discharge electronics, and hence, additional electronic power devices are used with the battery cells. It is difficult to meet the dual function requirement for small satellites with existing battery cell technology because a battery typically does not have self-contained electronic chargers and regulators disadvantageously requiring the remote, separate, and discrete electronic devices. New thin film batteries have been made using solid electrolytes. This thin film battery technology has the advantage of utilizing spray or vacuum deposition processes. However, such thin film batteries are stand-alone devices and require distal power routing to electronics devices. These and other disadvantages are solved or reduced using the invention.

SUMMARY OF THE INVENTION

An object of the invention is to provide a battery module having a thin film battery proximal to electronic devices.

Another object of the invention is to provide a battery module integrated with electronic devices.

Yet another object of the invention is to provide a battery module integrated with electronic devices using a thin film multilayer printed circuit board.

Still another object of the invention is to embedded a thin film battery in a thin film multilayer printer circuit board.

A further object of the invention is to provide a thin film battery module with an embedded thin film battery integrated with a thin film printed circuit board.

Yet a further object of the invention is to provide a thin film battery module with an embedded thin film battery integrated with a thin film printed circuit board on which electronic devices can be disposed for controlling the operation of the thin film battery.

The invention is directed to an integrated thin film battery module having an integrated circuit board. The integrated thin film battery module includes a flexible printed circuit, a thin film battery cell, and associated power regulating electronics. The flexible printed circuit can be used as the substrate for a thin film battery cell on one side, and for the mounting of electronic devices on the bottom side. In the preferred form, the module can be so integrated as to have effectively two printed circuit boards on each side of an embedded thin film battery for providing a top and bottom printed circuit board surface for respectively supporting top and bottom electronic devices.

The thin film printed circuit is preferably fabricated on a substrate composed of polyimide or other flexible polymer insulating materials. Copper or other suitable metal conductor traces are deposited on the polymer material over which another layer of polymer material is deposited. This layer deposition process is repeated to fabricate multilayer flexible printed circuit boards with embedded conductor traces. In a series of conventional processing steps, a thin film battery cell is deposited on the flexible circuit board. Preferably, a second multilayer flexible printed circuit board is then deposited on the battery cell so as to enclose and embed the battery cell material. Finally, discrete electronic devices are to be mounted on the top and bottom sides of the module as a self contained unit.

The thin film battery module can be manufactured using conventional thin film processes. The module is well suited for integrating load electronics and power processing DC-DC converters onto a flexible printed wiring board that also contains one or more thin film battery cells. The module can have commercial and space vacuum applications. These and other advantages will become more apparent from the following detailed description of the preferred embodiment.

DETAILED DESCRIPTION OF THE PREFERRED EMBODIMENT

Figure 1:
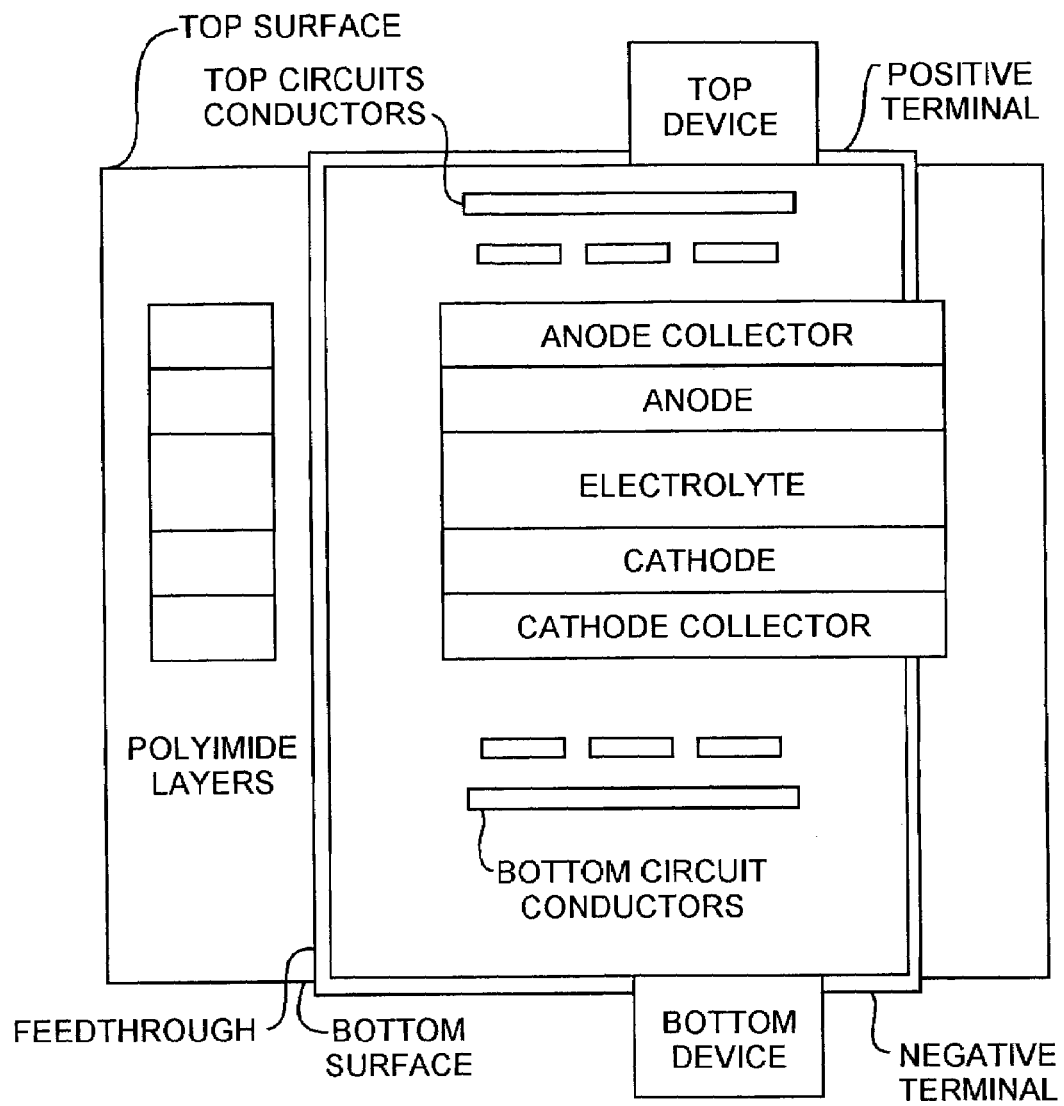
FIG. 1 is a diagram of an integrated thin film battery and circuit module.

An embodiment of the invention is described with reference to the figures using reference designations as shown in the figures. Referring to FIG. 1, an integrated thin film battery and circuit module includes a thin film battery cell that comprises an anode collector, an anode, an electrolyte, a cathode, and a cathode collector. The thin film battery can be deposited upon a polyimide substrate. The battery materials can be deposited through a shadow mask to obtain a specific cell pattern on the polyimide substrate. The polyimide substrate can be formed as a multilayer printed circuit board. The flexible circuit board is fabricated using multiple polyimide layers along with necessary embedded horizontally extending conductor traces and vertical extending feedthrough traces.

In the preferred form, one or more battery cells are disposed between two flexible printed circuits, a top circuit having top circuit conductor traces and a bottom circuit having bottom circuit conductor traces. The flexible circuits are made by repetitively alternately depositing polyimide layers and patterned horizontal conductor traces. After forming the bottom flexible printed circuit, thin film battery cell layers are deposited on the bottom flexible printed circuit through a shadow mask. The shadow mask defines the battery pattern and prevents the deposition of battery cell material in areas where feedthrough holes will be drilled through the flex printed circuit. After depositing the bottom flexible circuit and the battery layers, the top flexible circuit with embedded top conductor traces is deposited over the battery layers, as an integrated module. The feedthroughs are drilled and copper is deposited in the feedthroughs for forming vertical running conductor traces. The vertical extending copper feed through traces are connected to the horizontally extending conductor traces. The embedded vertical feedthrough and horizontal traces can be formed for interconnecting top and bottom electronic devices to the thin film battery cells. The vertical and horizontal traces are used to make electrical connections to the battery cell cathode and anode collectors through negative and positive terminals, as well as making electrical contact to the top and bottom electronic devices.

Figure 2:
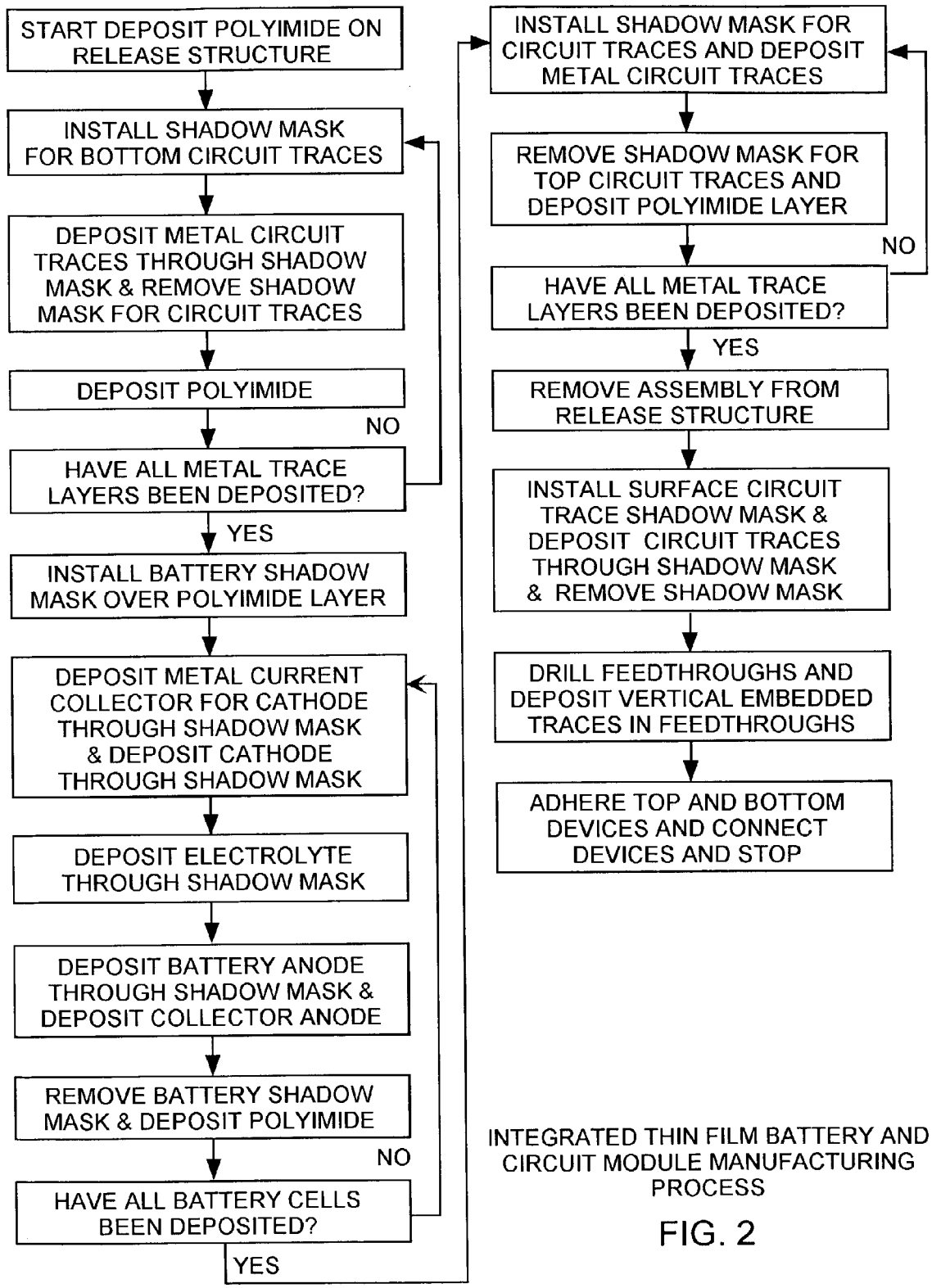
FIG. 2 is a flow diagram of an integrated thin film battery and circuit module manufacturing process.

Referring to FIGS. 1 and 2, and more particularly to FIG. 2, a manufacturing process is used for forming the integrated battery and circuit module using conventional thin film processes. The process is characterized as having three repetitive process loops for forming a plurality of layers of the bottom printed circuit, for forming a plurality of layers of a plurality of battery cells of the battery, and for forming a plurality of layers of the top printed circuit. At the start, a release structure, such as a sheet of Mylar, is used as a temporary support structure on which is firstly deposited the first circuit layer. A first layer of polyimide is deposited on the release structure. Then a shadow mask is used to deposit bottom circuit traces on the first layer polyimide. Another layer of insulating polyimide is deposited on the bottom circuit traces. Consecutive layers of insulating polyimide and patterned conductor traces are deposited until all of the layers of the first bottom circuit are fully deposited. The thin film battery is then deposited on the bottom circuit layer using a shadow mask. Patterned metal is deposited for forming the cathode collector and then cathode. The electrolyte is deposited over the cathode. The anode and then the anode collector are deposited over electrolyte thereby forming a first one of a plurality of thin film battery cells. The process for each cell is repeated until all of the cells are deposited, only the first of which is shown for convenience. A top printed circuit is then formed over the thin film battery. A plurality of polyimide layers with alternating conductor trace layers are deposited in sequence using shadow masks. When all of the layers are deposited, the last layer is a top conductor trace layer deposited on the top last polyimide layer surface of the thin film battery module.

After forming the bottom printed circuit, middle thin film battery, and top printed circuit with a top conductor trace layer, the thin film battery module is then released from the release structure. The module is flipped up side down, and a bottom trace layer is deposited on the now exposed bottom surface of the thin film battery module, so as to complete the formation of all of the horizontal conductor traces. Next, vertical feedthroughs are drilled through the printed circuit layers of the module and copper feedthrough traces are deposited into the drilled feedthroughs, thereby completing the formation of all of the conductive vertical and horizontal traces that are interconnected as horizontally extending conductor traces and vertically extending feedthrough traces. Specific feedthrough traces connected to the middle thin film battery are designated as positive and negative terminals of the battery. Next, and finally, top and bottom devices, are bonded to respectively top and bottom surfaces of the thin film battery modules, and electrically bonded to top and bottom surface conductor traces so as to electrically interconnect the top and bottom devices to the network of traces as well as to the thin film battery. The top and bottom devices are heat-producing devices, but are preferably electronic devices, such as voltage regulation and charging electronic devices.

The present invention is directed to an integrated thin film battery integrated with thin film printed circuit boards formed as flexible layers. Various insulating and conductive materials can be use to form the top and bottom insulating layers and conductive traces, though polyimide and copper are the preferred materials. Those skilled in the art can make enhancements, improvements, and modifications to the invention, and these enhancements, improvements, and modifications may nonetheless fall within the spirit and scope of the following claims.

What is claimed is:

1. A battery module for routing power, the module is a thin film module made from thin film processes, the module comprising,
   a first circuit layer comprising a first plurality of insulating polymer layers,
   conductor traces horizontally disposed between and on the first plurality of circuit layers,
   a thin film battery disposed on the first circuit layer,
   feedthrough traces vertically disposed through the plurality of circuit layers, and
   a first electronic device, the conductor traces and feedthrough traces serving to interconnect the first electronic device to the thin film battery.

2. The module of claim 1 wherein,
   the conductor traces are made of copper.

3. The module of claim 1 wherein,
   the feedthrough traces are made of copper.

4. The module of claim 1 wherein the thin film battery comprises,
   an anode collector,
   an anode,
   an electrolyte,
   a cathode, and
   a cathode collector.

5. The module of claim 1 wherein the thin film battery comprises,
   a plurality of thin film battery cells, each of the thin film battery cells comprises an anode collector, an anode, an electrolyte, a cathode, and a cathode collector.

6. The module of claim 1, wherein a first one of feedthrough traces is a positive terminal of the thin film battery, and a second one of the feedthrough traces is a negative terminal of the thin film battery.

7. The module of claim 1 further comprising, a second circuit layer comprising a second plurality of insulating polymer layers, the conducting traces further extending between and on the second plurality of insulating polymer layers, the feedthrough traces further extending vertically through the second circuit layer.

8. The module of claim 1 further comprising, a second circuit layer comprising a second plurality of insulating polymer layers, the conducting traces further extending between and on the second plurality of insulating polymer layers, the feedthrough traces further extending vertically through the second circuit layer, and a second electronic device disposed on the second circuit layer, the conductor traces and feedthrough traces serving to interconnect the first and second electronic devices to the thin film battery.

9. The module of claim 1 wherein the thin film battery comprises, a thin film cathode collector disposed as a thin film layer on the first circuit layer opposite the first electronic device, a thin film cathode disposed as a thin film layer on the thin film cathode collector, a thin film electrolyte disposed as a thin film layer on the thin film cathode, a thin film anode disposed as a layer on the electrolyte, and a thin film anode collector disposed as a layer on the thin film anode.

10. The module of claim 1 wherein the first circuit layer is made of polyimide.

11. The module of claim 1 wherein the first electronic devices is a power regulator.

12. A battery module for routing power, the module is a thin film module made from thin film processes, the module comprising, a first circuit layer comprising a first plurality of insulating polymer layers, first conductor traces horizontally disposed between and on the first plurality of circuit layers, a thin film battery cell disposed on the first circuit layer, the thin film battery comprising a thin film cathode collector disposed as a thin film layer on the first circuit layer opposite the first electronic device, comprising a thin film cathode disposed as a thin film layer on the thin film cathode collector, comprising a thin film electrolyte disposed as a thin film layer on the thin film cathode, comprising a thin film anode disposed as a layer on the electrolyte, and comprising a thin film anode collector disposed as a layer on the thin film anode, feedthrough traces vertically disposed through the first and second circuit layers, and a first electronic device disposed on the first circuit layer opposite the thin film battery cell, a second circuit layer disposed on the thin film battery cell and comprising a second plurality of insulating polymer layers, second conductor traces horizontally disposed between and on the first plurality of circuit layers, a second electronic device disposed on the second circuit layer opposite the thin film battery cell, the first and second conductor traces and feedthrough traces serving to interconnect the first and second electronic devices to the thin film battery cell.

13. The module of claim 1 wherein, the first and second conductor traces and the feedthrough traces are made of copper.

14. The module of claim 1 wherein, the first and second conductor traces and the feedthrough traces are made of copper, the first and second conductor traces are made by patterned deposition, and the feedthrough traces are formed by drilled holes in which copper is deposited.

* * * * *